United States Patent
Aoki et al.

(10) Patent No.: US 11,290,081 B2
(45) Date of Patent: Mar. 29, 2022

(54) RESONATOR ELEMENT, RESONATOR DEVICE, OSCILLATOR, ELECTRONIC DEVICE, AND VEHICLE

(71) Applicant: SEIKO EPSON CORPORATION, Tokyo (JP)

(72) Inventors: Shinya Aoki, Minowa-machi (JP); Byonhaku Yu, Minowa-machi (JP); Atsushi Matsuo, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/802,146

(22) Filed: Feb. 26, 2020

(65) Prior Publication Data
US 2020/0280299 A1   Sep. 3, 2020

(30) Foreign Application Priority Data
Feb. 28, 2019  (JP) .............................. JP2019-036530

(51) Int. Cl.
  *H03B 5/32*   (2006.01)
  *H03H 9/13*   (2006.01)
  *H03H 9/19*   (2006.01)
  *H03H 9/05*   (2006.01)

(52) U.S. Cl.
  CPC .............. *H03H 9/13* (2013.01); *H03B 5/32* (2013.01); *H03H 9/0538* (2013.01); *H03H 9/19* (2013.01)

(58) Field of Classification Search
  CPC .......... H03H 9/13; H03H 9/19; H03H 9/0538; H03B 5/32
  USPC ........................................................ 331/158
  See application file for complete search history.

(56) References Cited

U.S. PATENT DOCUMENTS

| | | | | |
|---|---|---|---|---|
| 2011/0140572 A1* | 6/2011 | Ichikawa | ................. | H03H 3/04 310/312 |
| 2012/0133248 A1* | 5/2012 | Kusano | ............. | H03H 9/02023 310/348 |
| 2013/0214648 A1* | 8/2013 | Yamada | ................... | H03H 9/19 310/366 |
| 2014/0252919 A1* | 9/2014 | Ariji | .................... | H03H 9/1035 310/344 |
| 2017/0272082 A1* | 9/2017 | Obata | ...................... | H03B 1/02 |

FOREIGN PATENT DOCUMENTS

| | | | |
|---|---|---|---|
| JP | 09326667 | * | 12/1997 |
| JP | 2012-195711 | | 10/2012 |
| JP | 2014-180050 | | 9/2014 |
| JP | 2017-200093 | | 11/2017 |
| WO | WO-2016140301 A1 * | 9/2016 | ........... H03H 9/0519 |

* cited by examiner

*Primary Examiner* — Richard Tan
(74) *Attorney, Agent, or Firm* — Workman Nydegger

(57) ABSTRACT

A resonator element includes a quartz crystal substrate including a supporting section, a resonating section, and a coupling section coupling the supporting section and the resonating section and having thickness smaller than the thickness of the supporting section, the supporting section including a first principal plane and a first side surface coupling the first principal plane and the coupling section, a first excitation electrode disposed in the resonating section, a second excitation electrode disposed in the resonating section and overlapping the first excitation electrode via the resonating section, and first and second pad electrodes including portions disposed on the first principal plane, the first and second pad electrodes being electrically coupled to the first and second excitation electrodes.

8 Claims, 16 Drawing Sheets

RESONATOR ELEMENT, RESONATOR DEVICE, OSCILLATOR, ELECTRONIC DEVICE, AND VEHICLE

The present application is based on, and claims priority from JP Application Serial Number 2019-036530, filed Feb. 28, 2019, the disclosure of which is hereby incorporated by reference herein in its entirety.

BACKGROUND

1. Technical Field

The present disclosure relates to a resonator element, a resonator device, an oscillator, an electronic device, and a vehicle.

2. Related Art

A quartz crystal resonator element described in JP A-2017-200093 (Patent Literature 1) includes an AT cut quartz crystal substrate and an electrode disposed on the surface of the quartz crystal substrate. The quartz crystal substrate includes a resonating section, a holding section thicker than the resonating section, and an inclined section located between the resonating section and the holding section and gradually increasing in thickness from the resonating section toward the holding section. On the other hand, the electrode includes a first excitation electrode disposed on the upper surface of the resonating section, a second excitation electrode disposed on the lower surface of the resonating section, a first pad electrode disposed in the holding section and the inclined section and coupled to the first excitation electrode, and a second pad electrode disposed in the holding section and the inclined section and coupled to the second excitation electrode.

Since the principal plane of the inclined section is inclined, when a metal film for forming the electrode is formed on the surface of the quartz crystal substrate, the thickness of the metal film is small compared with the thickness of the holding section and the resonating section. It is difficult to secure sufficient thickness. Therefore, the first and second pad electrodes formed in the inclined section do not have sufficient strength and easily partially peel. The peeling is likely to deteriorate a resonating characteristic, in particular, a DLD (Drive Level Dependence) characteristic of the quartz crystal resonator element.

SUMMARY

A resonator element according to an application example includes: a quartz crystal substrate including a supporting section, a resonating section, and a coupling section coupling the supporting section and the resonating section and having thickness smaller than thickness of the supporting section, the supporting section including a first principal plane orthogonal to a direction of the thickness and a first side surface coupling the first principal plane and the coupling section; a first excitation electrode disposed in the resonating section; a second excitation electrode disposed in the resonating section and overlapping the first excitation electrode via the resonating section in a plan view; a first pad electrode including a portion disposed on the first principal plane, the first pad electrode being electrically coupled to the first excitation electrode; and a second pad electrode including a portion disposed on the first principal plane, the second pad electrode being electrically coupled to the second excitation electrode. A portion disposed on the first principal plane of at least one of the first pad electrode and the second pad electrode is separated from at least a part of an outer edge of the first principal plane coupled to the first side surface.

In the resonator element according to this application example, the entire portion disposed on the first principal plane of at least one of the first pad electrode and the second pad electrode may be separated from the outer edge of the first principal plane.

In the resonator element according to this application example, the supporting section may include a first supporting section in which the first pad electrode is disposed and a second supporting section separated from the first supporting section, the second pad electrode being disposed in the second supporting section, and the coupling section may include a portion located between the first supporting section and the second supporting section and couple the first supporting section and the second supporting section.

In the resonator element according to this application example, the supporting section may further include a second principal plane that is in a front-rear relation with the first principal plane and a second side surface coupling the first principal plane and the second principal plane and configuring an outer side surface of the quartz crystal substrate, and the first pad electrode and the second pad electrode may respectively include a first portion disposed on the first principal plane, a second portion disposed on the second principal plane, and a third portion disposed on the second side surface and coupling the first portion and the second portion.

A resonator device according to an application example includes: the resonator element described above; and a package configured to house the resonator element.

An oscillator according to an application example includes: the resonator element described above; and an oscillation circuit configured to cause the resonator element to oscillate.

An electronic device according to an application example includes: the oscillator described above; and an arithmetic processing circuit configured to operate based on an oscillation signal output from the oscillator.

A vehicle according to an application example includes: the oscillator described above; and an arithmetic processing circuit configured to operate based on an oscillation signal output from the oscillator.

DESCRIPTION OF EXEMPLARY EMBODIMENTS

A resonator element, a resonator device, an oscillator, an electronic device, and a vehicle according to an application example are explained in detail below based on embodiments shown in the accompanying drawings.

First Embodiment

Figure 1:
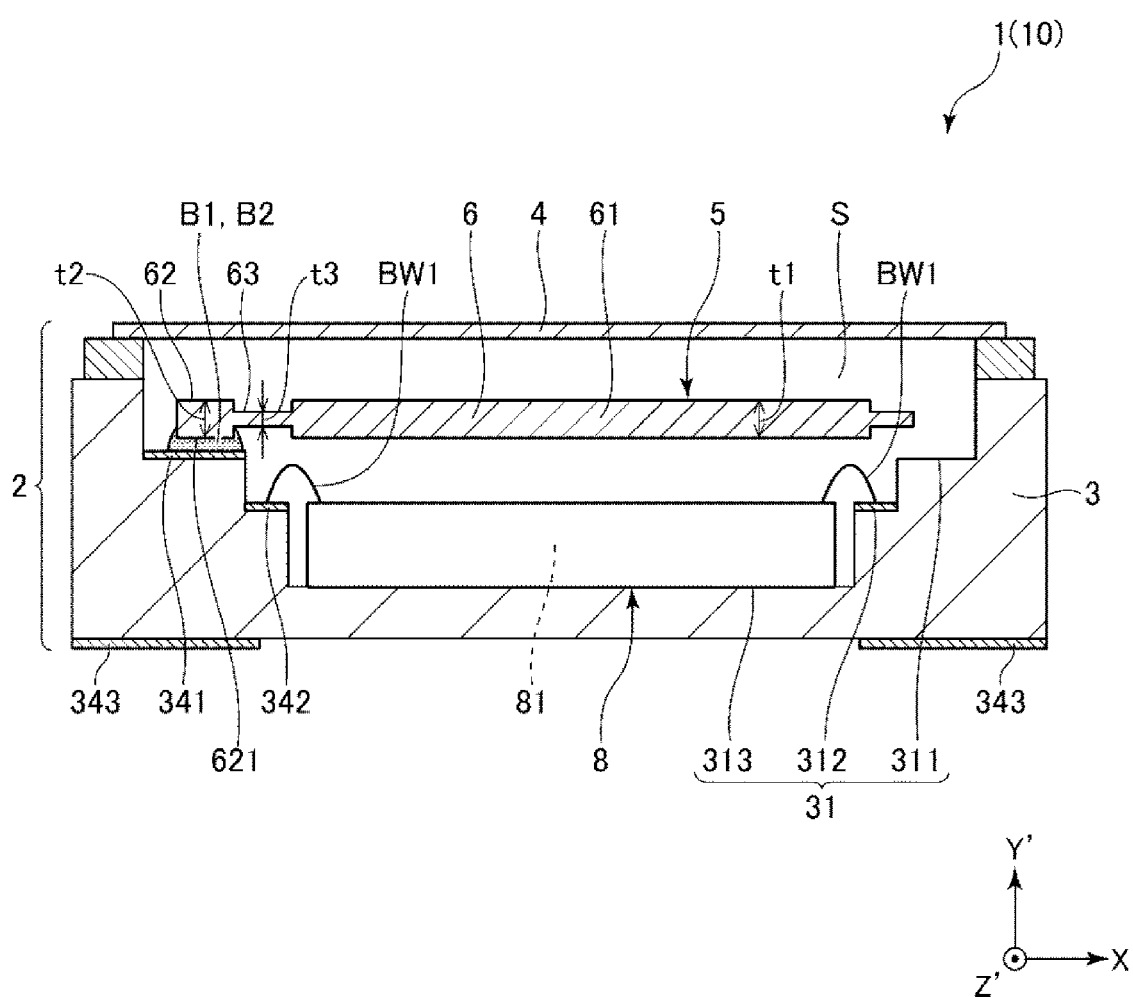
FIG. 1 is a sectional view showing an oscillator according to a first embodiment.
Figure 2:
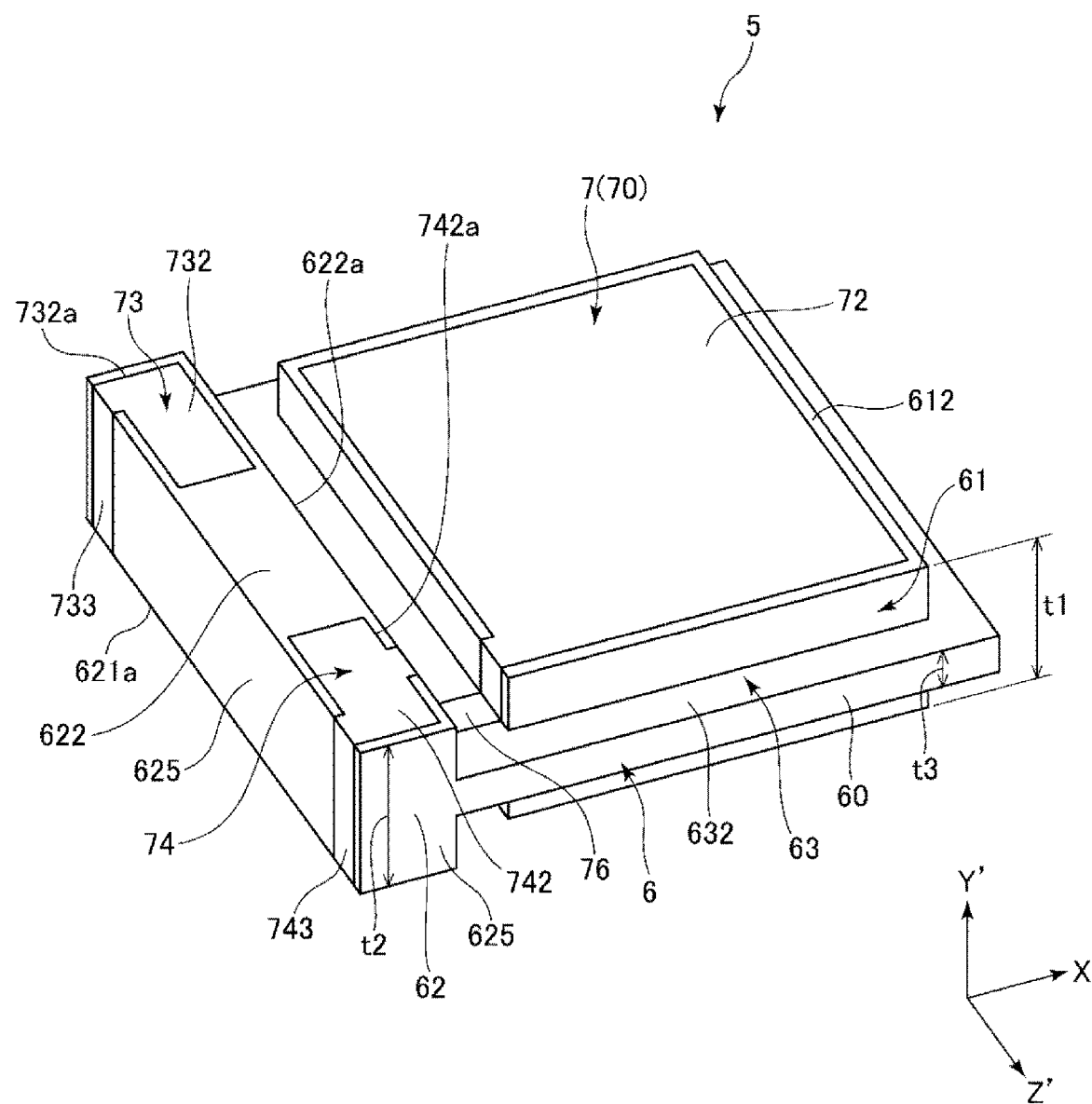
FIG. 2 is a perspective view of a resonator element included in the oscillator shown in FIG. 1.
Figure 3:
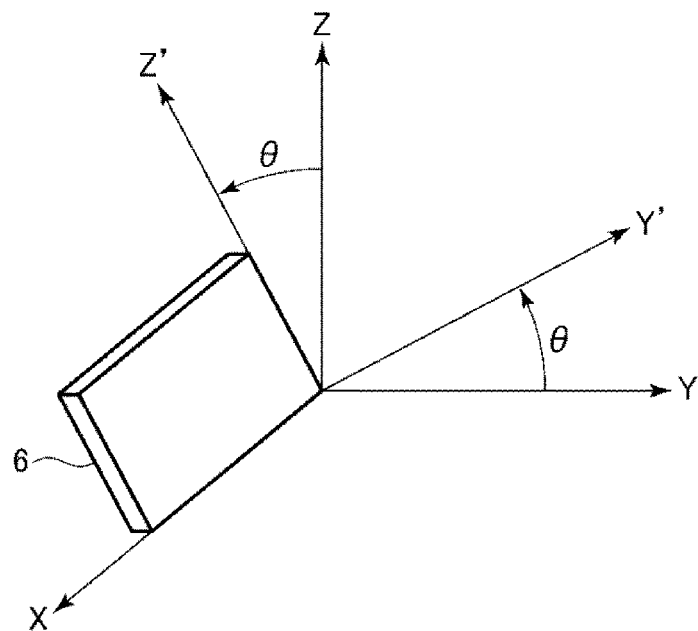
FIG. 3 is a diagram showing a cut angle of an AT cut.
Figure 4:
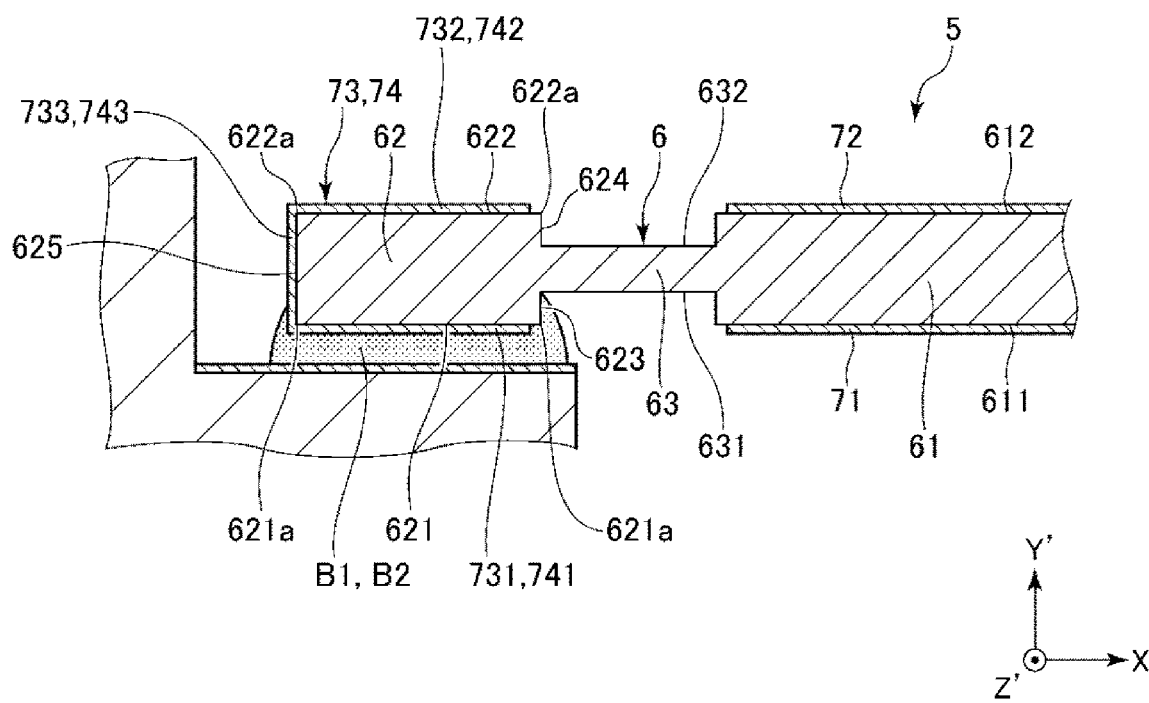
FIG. 4 is a sectional view showing a bonded state of the resonator element and a base.
Figure 5:
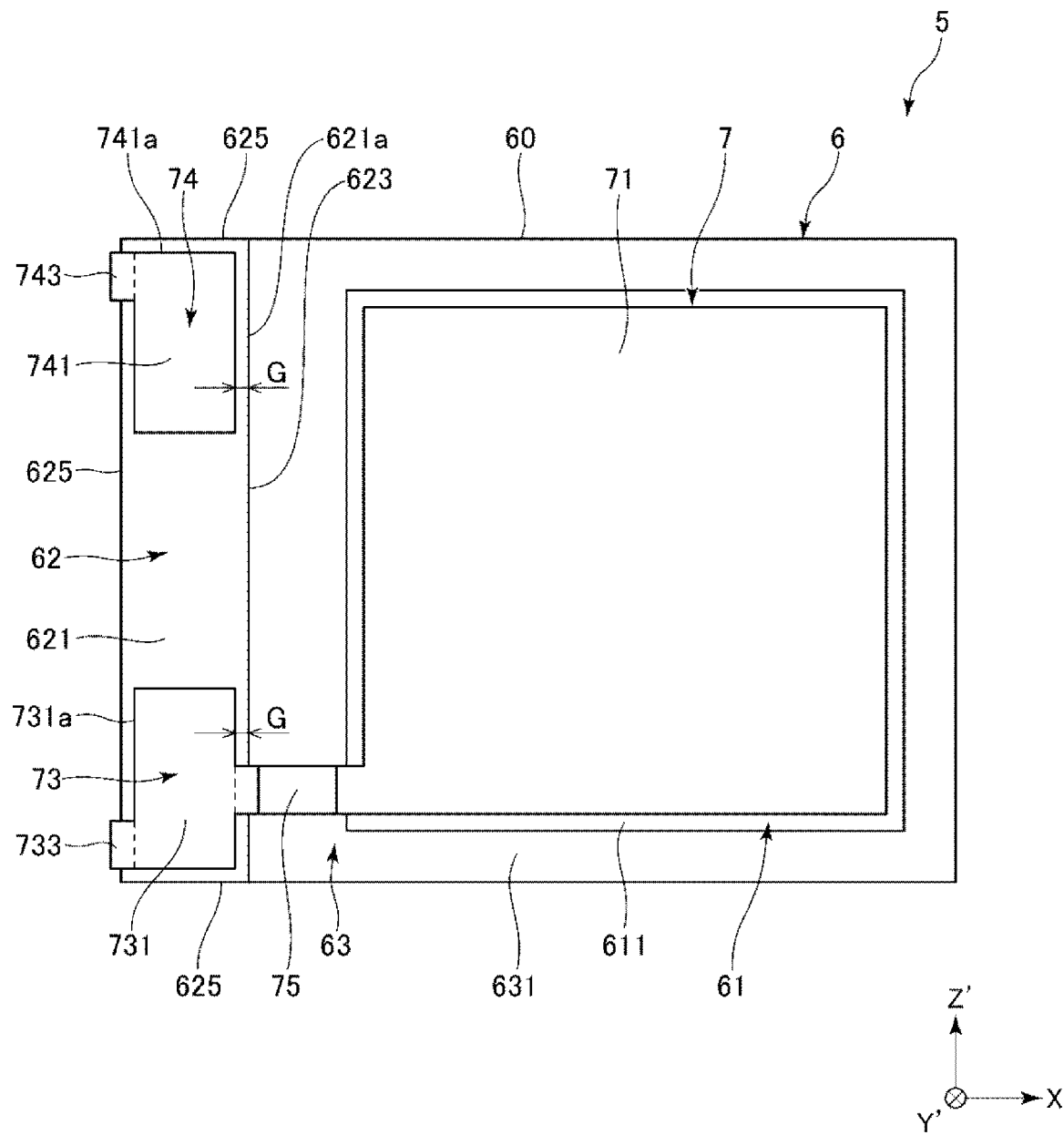
FIG. 5 is a plan view of the resonator element viewed from a Y'-axis direction minus side.
Figure 6:
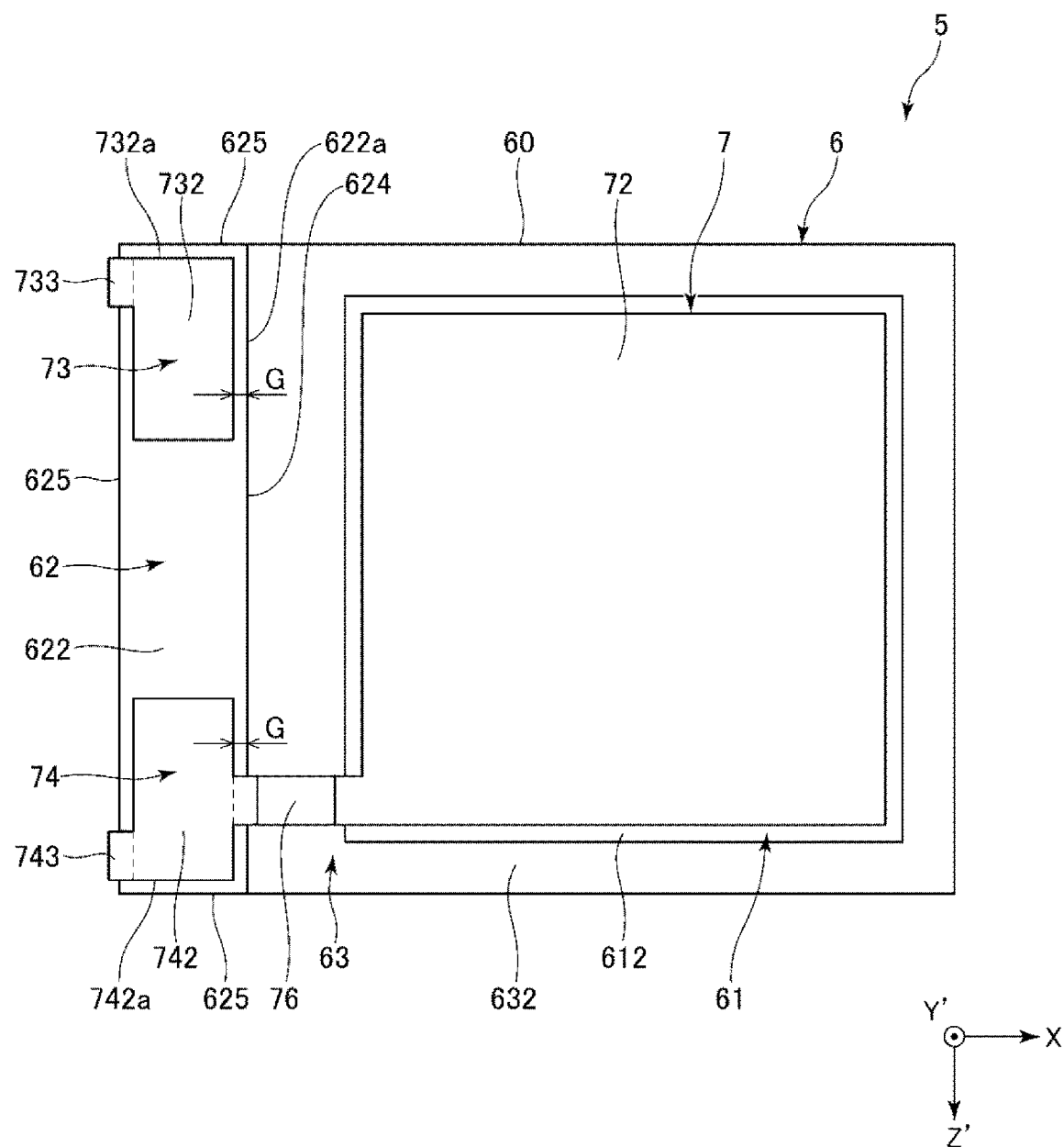
FIG. 6 is a plan view of the resonator element viewed from a Y'-axis direction plus side.
Figure 7:
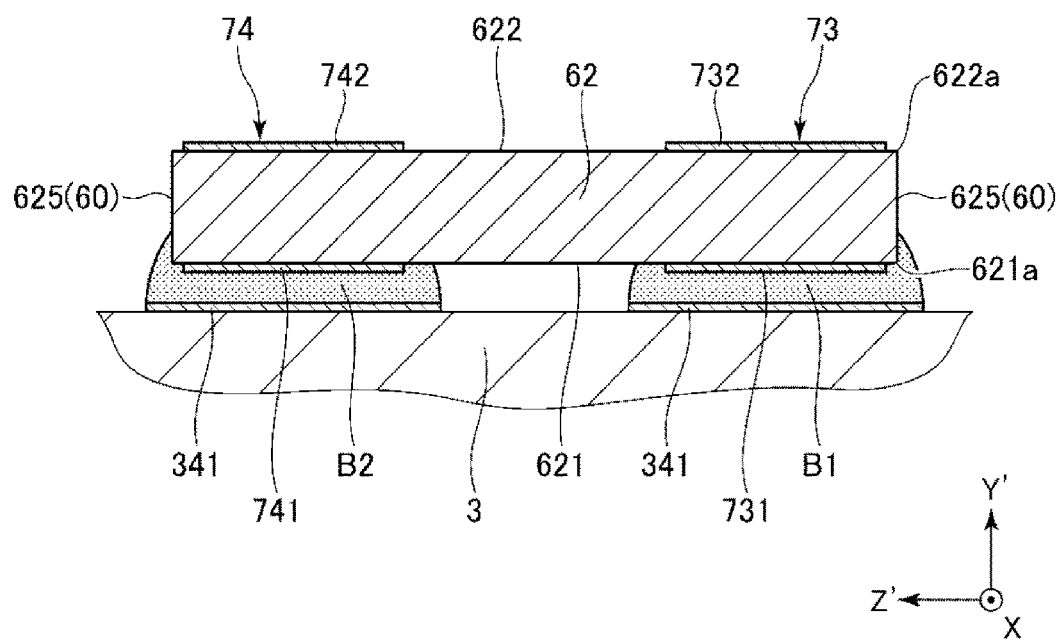
FIG. 7 is a sectional view showing the bonded state of the resonator element and the base.

FIG. 1 is a sectional view showing an oscillator according to a first embodiment. FIG. 2 is a perspective view of a resonator element included in the oscillator shown in FIG. 1. FIG. 3 is a diagram showing a cut angle of an AT cut. FIG. 4 is a sectional view showing a bonded state of the resonator element and a base. FIG. 5 is a plan view of the resonator element viewed from a Y'-axis direction minus side. FIG. 6 is a plan view of the resonator element viewed from a Y'-axis direction plus side. FIG. 7 is a sectional view showing the bonded state of the resonator element and the base.

As shown in FIG. 1, an oscillator 1 applied with a resonator device 10 includes a package 2 and a resonator element 5 and a circuit element 8 housed in the package 2. The resonator device 10 is configured by the package 2 and the resonator element 5.

The package 2 includes a box-like base 3 including a recess 31 opened to the upper surface thereof and a tabular lid 4 closing the opening of the recess 31 and bonded to the upper surface of the base 3. The opening of the recess 31 is closed by the lid 4, whereby a housing space S for housing the resonator element 5 and the circuit element 8 is formed. The housing space S is airtight and is in a decompressed state, more desirably, a state closer to vacuum. Consequently, viscous resistance decreases and the resonator element 5 can be stably driven. However, the atmosphere of the housing space S is not particularly limited and may be, for example, atmosphere encapsulating an inert gas such as nitrogen or Ar or may be in an atmospheric pressure state or a pressurized state rather than the decompressed state.

The recess 31 formed in the base 3 includes a first recess 311 opened to the upper surface of the base 3, a second recess 312 opened to the bottom surface of the first recess 311, and a third recess 313 opened to the bottom surface of the second recess 312. The resonator element 5 is fixed to the bottom surface of the first recess 311. The circuit element 8 is fixed to the bottom surface of the third recess 313. However, the configuration of the recess 31 is not particularly limited.

A plurality of (two) internal terminals 341 are disposed on the bottom surface of the first recess 311. A plurality of internal terminals 342 are disposed on the bottom surface of the second recess 312. A plurality of external terminals 343 are disposed on the lower surface of the base 3. The internal terminals 341 and 342 and the external terminals 343 are electrically coupled via a not-shown wire formed in the base 3. The plurality of internal terminals 341 are respectively electrically coupled to the resonator element 5 via conductive bonding members B1 and B2. The plurality of internal terminals 342 are respectively electrically coupled to the circuit element 8 via bonding wires BW1.

A constituent material of the base 3 is not particularly limited. For example, various ceramics such as aluminum oxide can be used. On the other hand, a constituent material of the lid 4 is not particularly limited. However, the constituent material of the lid 4 is desirably a member having a coefficient of linear expansion approximate to a coefficient of linear expansion of the constituent material of the base 3. For example, when the constituent material of the base 3 is the ceramics, the constituent material of the lid 4 is desirably an alloy such as Kovar.

The circuit element 8 includes an oscillation circuit 81. The oscillation circuit 81 is a circuit that is electrically coupled to the resonator element 5 amplifies an output signal of the resonator element 5 and feedbacks the amplified signal to the resonator element 5 to thereby cause the resonator element 5 to oscillate. As the oscillation circuit 81, for example, an oscillation circuit such as a Pierce oscillation circuit, an inverter-type oscillation circuit, a Colpitts oscillation circuit, or a Hartley oscillation circuit can be used.

As shown in FIG. 2, the resonator element 5 includes an AT cut quartz crystal substrate 6 and an electrode 7 disposed on the quartz crystal substrate 6. The AT cut quartz crystal substrate 6 has a thickness shear mode and has a third order frequency-temperature characteristic. Therefore, the resonator element 5 has an excellent temperature characteristic. The electrode 7 can be formed by forming a metal film 70 on the surface of the quartz crystal substrate 6 and patterning the metal film 70 with etching.

The AT cut quartz crystal substrate 6 is briefly explained. The quartz crystal substrate 6 has crystal axes X, Y, and Z orthogonal to one another. The X axis, the Y axis, and the Z axis are respectively called electrical axis, mechanical axis, and optical axis. As shown in FIG. 3, the quartz crystal substrate 6 is a "rotary Y-cut quartz crystal substrate" cut along a plane obtained by rotating an X-Z plane a predetermined angle θ around the X axis. A substrate having the angle θ=35° 15' is called "AT cut quartz crystal substrate". In the following explanation, the Y axis and the Z axis rotated around the X axis according to the angle θ are represented as a Y' axis and a Z' axis. A distal end side of arrows of the axes is referred to as "plus side" as well and the opposite side of the "plus side" is referred to as "minus side" as well. However, a cut angle of the quartz crystal substrate 6 is not particularly limited.

The quartz crystal substrate 6 is a rectangle in a plan view from the Y'-axis direction. In particular, in this embodiment, the quartz crystal substrate 6 is an oblong, the longitudinal direction of which is the X-axis direction. However, the plan view shape of the quartz crystal substrate 6 is not particularly limited and may be, for example, an oblong, the longitudinal direction of which is the Z'-axis direction. The quartz crystal substrate 6 includes a resonating section 61, a supporting section 62 located on an X-axis direction minus side with respect to the resonating section 61, and a coupling section 63 that is located between the resonating section 61 and the supporting section 62 and around the supporting section 62 and couples the resonating section 61 and the supporting section 62. As shown in FIG. 1, the resonator element 5 is fixed to the base 3 via the conductive bonding members B1 and B2 on a lower surface 621 of the supporting section 62.

The bonding members B1 and B2 are not particularly limited if the bonding members B1 and B2 has both of electric conductivity and bondability. However, in this embodiment, a conductive adhesive or the like obtained by dispersing a conductive filler such as a silver filler in a polyimide-based, epoxy-based, silicone-based, or acrylic-based adhesive is used. The bonding members B1 and B2 are relatively softened by using the conductive adhesive. For example, thermal stress caused by a coefficient of thermal expansion difference between the base 3 and the quartz crystal substrate 6 is reduced by the bonding members B1 and B2 and is less easily transmitted to the resonator element 5. However, as the bonding members B1 and B2, a metal bump such as a gold bump or a copper bump can also be used besides the conductive adhesive. An outgas from the bonding members B1 and B2 can be suppressed by using the metal bump. It is possible to effectively suppress an environment change, in particular, a rise in pressure of the housing space S.

The coupling section 63 is thinner than the resonating section 61 and the supporting section 62. That is, when the thickness in the Y'-axis direction of the resonating section 61 is represented as t1, the thickness in the Y'-axis direction of the supporting section 62 is represented as t2, and the thickness in the Y'-axis direction of the coupling section 63 is represented as t3, t3<t1 and t3<t2. With t3<t1, the resonator element 5 is a "mesa-type" in which the resonating section 61 further projects in the Y'-axis direction than the coupling section 63 around the resonating section 61. Resonance of the resonating section 61 can be effectively confined within the resonating section 61. Therefore, a resonance leak is suppressed. The resonator element 5 has an excellent resonating characteristic.

With t3<t2, it is easy to mount the resonator element 5 on the base 3. A handling characteristic of the resonator element 5 is improved. Specifically, by further projecting the supporting section 62 in the Y'-axis direction than the coupling section 63, as shown in FIG. 4, the bonding members B1 and B2 wet and spread to not only the lower surface 621 of the supporting section 62 but also side surfaces of the supporting section 62, specifically, a first side surface 623 and a second side surface 625 explained below. Therefore, a contact area of the resonator element 5 and the bonding members B1 and B2 increases and, accordingly, bonding strength of the resonator element 5 and the bonding members B1 and B2 increases. Since the bonding members B1 and B2 sneak to the side surfaces of the supporting section 62, it is possible to suppress further planar spread (spread in the X-axis direction) of the bonding members B1 and B2. Therefore, it is possible to reduce the contact area of the resonator element 5 and the bonding members B1 and B2 as much as possible in a plan view. The thermal stress is less easily transmitted to the resonator element 5. Note that t3/t1 is not particularly limited but is desirably, for example, approximately $0.4 \leq t3/t1 \leq 0.8$. The same applies to t3/t2.

In particular, in this embodiment, the resonating section 61 and the supporting section 62 respectively symmetrically project further to Y'-axis direction both sides than the coupling section 63. Consequently, since the quartz crystal substrate 6 becomes front-rear symmetrical and there is no distinction of the front and the rear of the quartz crystal substrate 6, the quartz crystal substrate 6 can be mounted on the base 3 in both the front and rear directions. Therefore, the handling characteristic in mounting the resonator element 5 on the base 3 is improved. In this embodiment, the thickness t1 of the resonating section 61 and the thickness t2 of the supporting section 62 are equal, that is, t1=t2. The principal planes on the Y'-axis direction plus side of the resonating section 61 and the supporting section 62 are flush with each other and the principal planes on the Y'-axis direction minus side of the resonating section 61 and the supporting section 62 are flush with each other. Therefore, it is easy to manufacture the quartz crystal substrate 6. Specifically, the quartz crystal substrate 6 is obtained by only preparing a flat quartz crystal substrate and uniformly etching only a portion equivalent to the coupling section 63 from both surface sides thereof to thin the portion.

The supporting section 62 is located at the end on the X-axis direction minus side of the quartz crystal substrate 6. The supporting section 62 includes, as shown in FIG. 4, the lower surface 621 functioning as a first principal plane located further on the Y'-axis direction minus side than a lower surface 631 of the coupling section 63, an upper surface 622 functioning as a second principal plane that is in a front-rear relation with the lower surface 621 and located further on the Y'-axis direction plus side than an upper surface 632 of the coupling section 63, the first side surface 623 coupling the lower surface 621 and the lower surface 631, a first side surface 624 coupling the upper surface 622 and the upper surface 632, and a second side surface 625 coupling the lower surface 621 and the upper surface 622 and configuring a part of the outer edge, that is, an outer side surface 60 of the quartz crystal substrate 6.

However, the quartz crystal substrate 6 is not limited to the shape shown in FIG. 4. For example, the resonating section 61 and the supporting section 62 may respectively have shapes further projecting to only one side in the Y'-axis direction than the coupling section 63. Projecting directions of the resonating section 61 and the supporting section 62 may be the same or may be different from each other. The quartz crystal substrate 6 may be a flat type in which the thickness t1 of the resonating section 61 and the thickness t3 of the coupling section 63 are equal or may be a reverse mesa type in which the thickness t1 of the resonating section 61 is smaller than the thickness t3 of the coupling section 63 and the resonating section 61 is recessed from the coupling section 63. Bevel machining for grinding and chamfering the periphery of the quartz crystal substrate 6 or convex machining for forming the upper surface and the lower surface of the quartz crystal substrate 6 as convex curved surfaces may be applied.

The electrode 7 is explained. As shown in FIGS. 5 and 6, the electrode 7 includes a first excitation electrode 71 disposed on a lower surface 611 of the resonating section 61 and a second excitation electrode 72 disposed on an upper surface 612 of the resonating section 61 and opposed to the first excitation electrode 71 across the resonating section 61. Further, the electrode 7 includes a first pad electrode 73 and a second pad electrode 74 disposed in the supporting section 62 and arranged side by side in the Z'-axis direction, a first lead-out wire 75 electrically coupling the first excitation electrode 71 and the first pad electrode 73 through the coupling section 63, and a second lead-out wire 76 electrically coupling the second excitation electrode 72 and the second pad electrode 74 through the coupling section 63.

The first pad electrode 73 includes a first portion 731 disposed on the lower surface 621 of the supporting section 62, a second portion 732 disposed on the upper surface 622 of the supporting section 62, and a third portion 733 disposed on the second side surface 625 of the supporting section 62 and electrically coupling the first portion 731 and the second portion 732. Similarly, the second pad electrode 74 includes a first portion 741 disposed on the lower surface 621 of the supporting section 62, a second portion 742 disposed on the upper surface 622 of the supporting section 62, and a third portion 743 disposed on the second side surface 625 of the supporting section 62 and electrically coupling the first portion 741 and the second portion 742. As shown in FIG. 7, in the first portion 731, the first pad electrode 73 and one internal terminal 341 are electrically coupled via the bonding member B1. In the first portion 741, the second pad electrode 74 and the other internal terminal 341 are electrically coupled via the bonding member B2.

By disposing the first pad electrode 73 and the second pad electrode 74 respectively on the lower surface 621 and the upper surface 622 of the supporting section 62 in this way, the disposition of the electrode 7 is the same in the front and the rear and there is no distinction of the front and the rear of the electrode 7. Therefore, even if the resonator element 5 is vertically reversed with respect to the configuration shown in FIGS. 5 and 6, the resonator element 5 can be mounted on the base 3 in the same manner as the configuration. Consequently, the handling characteristic in mounting the resonator element 5 on the base 3 is improved. However, the configuration of the first pad electrode 73 and the second pad electrode 74 is not particularly limited. The second portion 732 and the third portion 733 may be omitted from the first pad electrode 73. The second portion 742 and the third portion 743 may be omitted from the second pad electrode 74.

As shown in FIG. 5, in the first pad electrode 73, an entire outer edge 731*a* of the first portion 731 is separated from an outer edge 621*a* of the lower surface 621 and located on the inner side of the outer edge 621*a*. That is, the entire first portion 731 is included in the lower surface 621. A gap G is formed between the outer edge 731*a* and the outer edge 621*a*. The outer edge 621*a* of the lower surface 621 is considered to be a coupling portion of (a boundary between) the lower surface 621 and the first and second side surfaces 623 and 625 as well. Since the outer edge 731*a* of the first portion 731 is located on the inner side of the outer edge 621*a* of the lower surface 621 in this way, the first portion 731 less easily peels compared with, for example, when the outer edge 731*a* coincides with the outer edge 621*a* and when the outer edge 731*a* is located further on the outer side than the outer edge 621*a*, that is, the first portion 731 is formed to spread to the first side surface 623 and the second side surface 625. Therefore, it is possible to effectively suppress deterioration in a resonating characteristic, in particular, a DLD (Drive Level Dependence) characteristic of the resonator element 5.

As in this embodiment, it is most desirable that the entire periphery of the outer edge 731*a* of the first portion 731 is separated from the outer edge 621*a* of the lower surface 621 and located on the inner side of the outer edge 621*a*. However, not only this but, as in a second embodiment explained below, the outer edge 731*a* of the first portion 731 only has to be separated from the outer edge 621*a* of the lower surface 621 and located on the inner side of the outer edge 621*a* at least in the boundary between the lower surface 621 and the first side surface 623. In this case, it is desirable that the outer edge 731*a* of the first portion 731 is separated from the outer edge 621*a* of the lower surface 621 and located on the inner side of the outer edge 621*a* in the entire boundary between the lower surface 621 and the first side surface 623. However, the outer edge 731*a* of the first portion 731 may be separated from the outer edge 621*a* of the lower surface 621 and located on the inner side of the outer edge 621*a* in a part of the boundary between the lower surface 621 and the first side surface 623. Since likelihood of causing deterioration in the DLD characteristic is higher as a peeling part of the electrode 7 is closer to the resonating section 61, the outer edge 731*a* of the first portion 731 is separated from the outer edge 621*a* of the lower surface 621 and located on the inner side of the outer edge 621*a* at least in the boundary between the first side surface 623 and the lower surface 621 closest to the resonating section 61 in the side surface of the supporting section 62 as explained above, and thereby it is possible to suppress the deterioration in the DLD characteristic. The same applies to the second portion 732 of the first pad electrode 73 and the first and second portions 741 and 742 of the second pad electrode 74.

As shown in FIG. 6, in the first pad electrode 73, an entire outer edge 732*a* of the second portion 732 is separated from an outer edge 622*a* of the upper surface 622 and located on the inner side of the outer edge 622*a*. That is, the entire second portion 732 is included in the upper surface 622. The gap G is formed between the outer edge 732*a* and the outer edge 622*a*. The outer edge 622*a* of the upper surface 622 is considered to be a coupling portion of (a boundary between) the upper surface 622 and the first and second side surfaces 624 and 625 as well. Since the outer edge 732*a* of the second portion 732 is located on the inner side of the outer edge 622*a* of the upper surface 622 in this way, the second portion 732 less easily peels compared with, for example, when the outer edge 732*a* coincides with the outer edge 622*a* and when the outer edge 732*a* is located further on the outer side than the outer edge 622*a*, that is, the second portion 732 is formed to spread to the first side surface 624 and the second side surface 625. Therefore, it is possible to effectively suppress deterioration in the resonating characteristic, in particular, the DLD characteristic of the resonator element 5.

The third portion 733 coupling the first portion 731 and the second portion 732 is disposed on the lower surface 621, the upper surface 622, and the second side surface 625. Since the second side surface 625 is distant from the resonating section 61 compared with the first side surfaces 623 and 624, by disposing the third portion 733 in the portion of the second side surface 625, it is possible to minimize the influence on the DLD characteristic even if the third portion 733 peels.

The second pad electrode 74 has the same configuration as the first pad electrode 73. That is, in the second pad electrode 74, as shown in FIG. 5, an entire outer edge 741*a* of the first portion 741 is separated from the outer edge 621*a* of the lower surface 621 and located on the inner side of the outer edge 621*a*. That is, the entire first portion 741 is included in the lower surface 621. The gap G is formed between the outer edge 741a and the outer edge 621a. Since the outer edge 741a of the first portion 741 is located on the inner side of the outer edge 621a of the lower surface 621 in this way, the first portion 741 less easily peels compared with, for example, when the outer edge 741a coincides with the outer edge 621a and when the outer edge 741a is located further on the outer side than the outer edge 621a, that is, the first portion 741 is formed to spread to the first side surface 623 and the second side surface 625. Therefore, it is possible to effectively suppress deterioration in the resonating characteristic, in particular, the DLD characteristic of the resonator element 5.

In the second pad electrode 74, as shown in FIG. 6, an entire outer edge 742a of the second portion 742 is separated from an outer edge 622a of the upper surface 622 and located on the inner side of the outer edge 622a. That is, the entire second portion 742 is included in the upper surface 622. The gap G is formed between the outer edge 742a and the outer edge 622a. Since the outer edge 742a of the second portion 742 is located on the inner side of the outer edge 622a of the upper surface 622 in this way, the second portion 742 less easily peels compared with, for example, when the outer edge 742a coincides with the outer edge 622a and when the outer edge 742a is located further on the outer side than the outer edge 622a, that is, the second portion 742 is formed to spread to the first side surface 624 and the second side surface 625. Therefore, it is possible to effectively suppress deterioration in the resonating characteristic, in particular, the DLD characteristic of the resonator element 5.

The third portion 743 coupling the first portion 741 and the second portion 742 is disposed on the lower surface 621, the upper surface 622, and the second side surface 625. Since the second side surface 625 is distant from the resonating section 61 compared with the first side surfaces 623 and 624, by disposing the third portion 743 in the portion of the second side surface 625, it is possible to minimize the influence on the DLD characteristic even if the third portion 743 peels.

The oscillator 1 is explained above. As explained above, the resonator element 5 included in the oscillator 1 includes the supporting section 62, the resonating section 61, and the coupling section 63 coupling the supporting section 62 and the resonating section 61 and thinner than the supporting section 62. The supporting section 62 includes the quartz crystal substrate 6 including the lower surface 621, which is the first principal plane, and the first side surface 623 coupling the lower surface 621 and the coupling section 63, the first excitation electrode 71 disposed in the resonating section 61, the second excitation electrode 72 disposed in the resonating section 61 and opposed to the first excitation electrode 71 via the resonating section 61, the first pad electrode 73 including the first portion 731, which is the portion disposed on the lower surface 621, and electrically coupled to the first excitation electrode 71, and the second pad electrode 74 including the first portion 741, which is the portion disposed on the lower surface 621, and electrically coupled to the second excitation electrode 72. In at least one of the first pad electrode 73 and the second pad electrode 74, the first portion 731 or 741 disposed on the lower surface 621 is separated from at least a part of the outer edge 621a coupled to the first side surface 623 of the lower surface 621.

By adopting such a configuration, portions of the first portions 731 and 741 on sides close to the resonating section 61 less easily peel. It is possible to effectively suppress deterioration in the resonating characteristic, in particular, the DLD characteristic of the resonator element 5. In particular, in this embodiment, since both of the first pad electrode 73 and the second pad electrode 74 satisfy the configuration, it is possible to more conspicuously exert the effect. However, not only this, but at least one of the first pad electrode 73 and the second pad electrode 74 only has to satisfy the configuration.

As explained above, in at least one of the first pad electrode 73 and the second pad electrode 74, the entire first portion 731 or 741 disposed on the lower surface 621 is separated from the outer edge 621a of the lower surface 621. Consequently, the first portions 731 and 741 much less easily peel. It is possible to more effectively suppress deterioration in the resonating characteristic, in particular, the DLD characteristic of the resonator element 5. In particular, in this embodiment, since both of the first pad electrode 73 and the second pad electrode 74 satisfy the configuration, it is possible to more conspicuously exert the effect.

As explained above, the supporting section 62 further includes the upper surface 622 functioning as the second principal plane that is in the front-rear relation with the lower surface 621 and the second side surface 625 coupling the lower surface 621 and the upper surface 622 and configuring the outer side surface 60 of the quartz crystal substrate 6. The first pad electrode 73 and the second pad electrode 74 respectively include the first portions 731 and 741 disposed on the lower surface 621, the second portions 732 and 742 disposed on the upper surface 622, and the third portions 733 and 743 disposed on the second side surface 625 and coupling the first portions 731 and 741 and the second portions 732 and 742. Consequently, the quartz crystal substrate 6 can be mounted on the base 3 in both upward and downward postures. The handling characteristic of the resonator element 5 is improved.

As explained above, the resonator device 10 includes the resonator element 5 and the package 2 that houses the resonator element 5. Consequently, the resonator element 5 can be protected. The resonator device 10 can enjoy the effects of the resonator element 5 explained above and exert excellent reliability.

As explained above, the oscillator 1 includes the resonator element 5 and the oscillation circuit 81 that causes the resonator element 5 to oscillate. Consequently, the oscillator 1 can enjoy the effects of the resonator element 5 explained above and exert excellent reliability.

Second Embodiment

Figure 8:
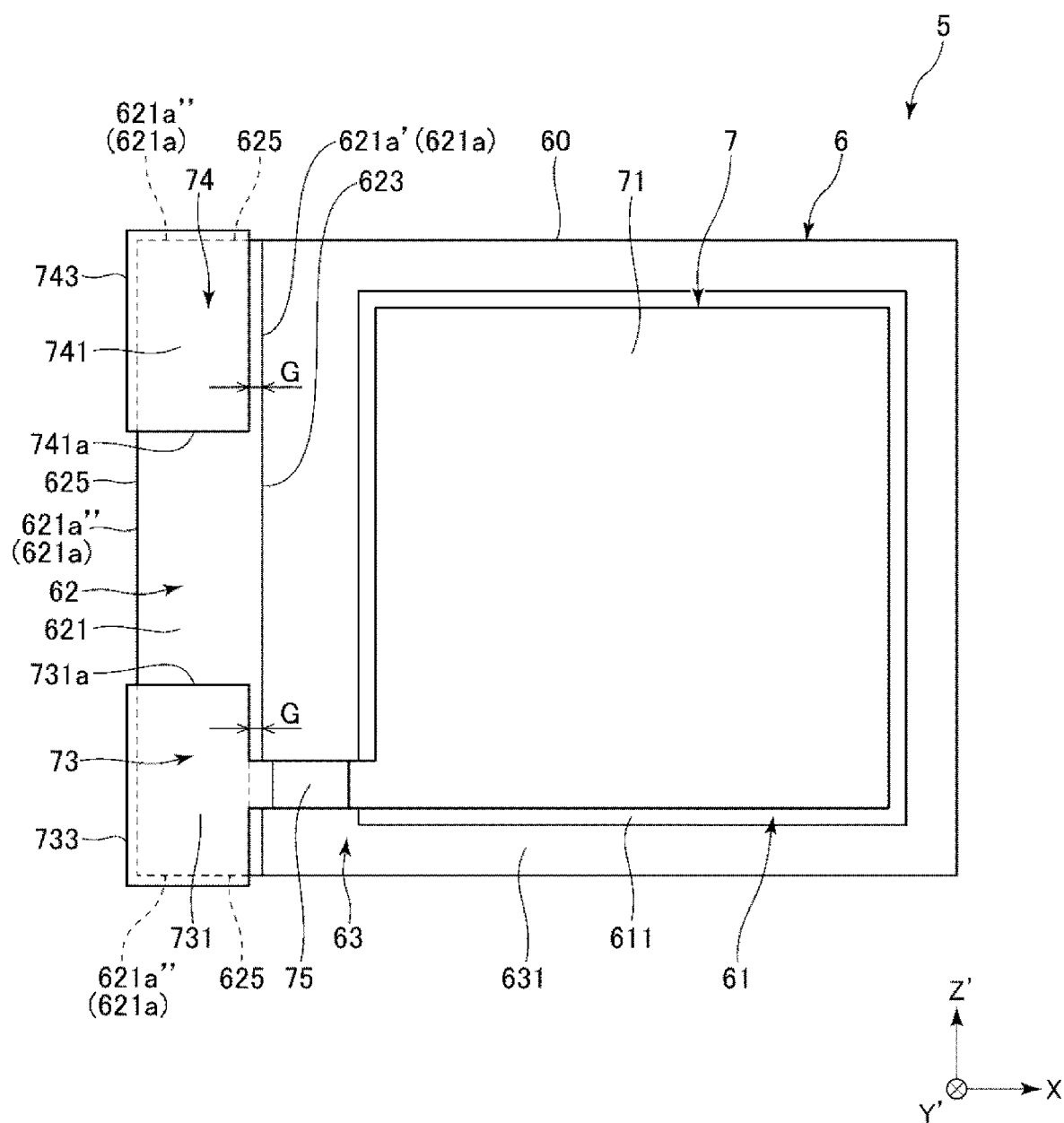
FIG. 8 is a plan view of a resonator element according to a second embodiment viewed from the Y'-axis direction minus side.
Figure 9:
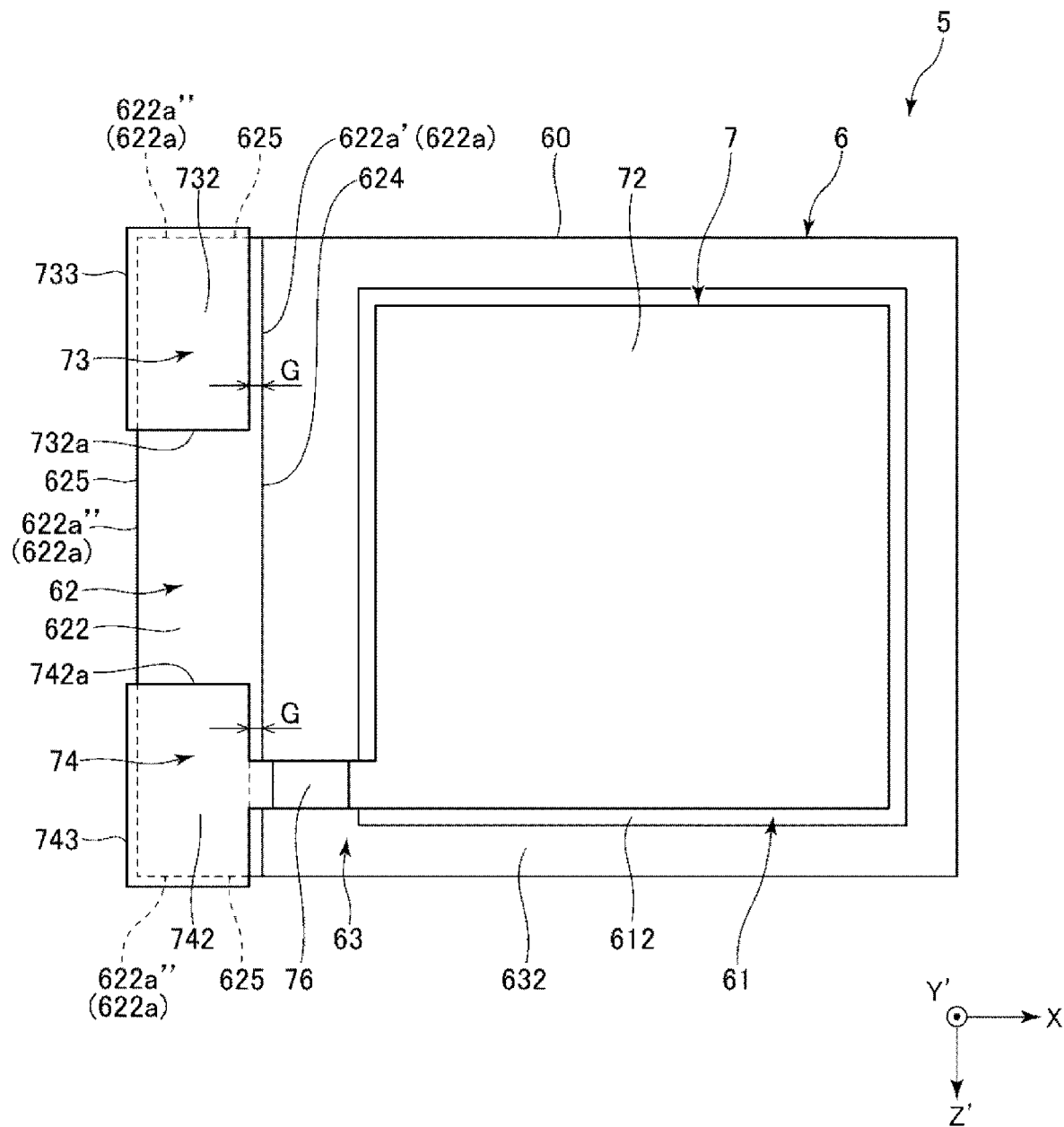
FIG. 9 is a plan view of the resonator element according to the second embodiment viewed from the Y'-axis direction plus side.

FIG. 8 is a plan view of a resonator element according to a second embodiment viewed from the Y'-axis direction minus side. FIG. 9 is a plan view of the resonator element according to the second embodiment viewed from the Y'-axis direction plus side.

The oscillator 1 according to this embodiment is the same as the oscillator 1 according to the first embodiment except that the configuration of the resonator element 5 is different. In the following explanation, concerning the oscillator 1 according to the second embodiment, differences from the first embodiment are mainly explained. Explanation concerning similarities is omitted. In FIGS. 8 and 9, the same components as the components in the first embodiment are denoted by the same reference numerals and signs.

As shown in FIGS. 8 and 9, the first portion 731 of the first pad electrode 73 is separated from, in the outer edge 621a of the lower surface 621, a portion 621a' coupled to the first side surface 623. The gap G is formed between the first portion 731 and the portion 621a'. However, the first portion 731 overlaps a portion 621a" coupled to the second side surface 625. Similarly, the second portion 732 of the first pad electrode 73 is separated from, in the outer edge 622a of the upper surface 622, a portion 622a' coupled to the first side surface 624. The gap G is formed between the second portion 732 and the portion 622a'. However, the second portion 732 overlaps a portion 622a" coupled to the second side surface 625.

The first portion 741 of the second pad electrode 74 is separated from, in the outer edge 621a of the lower surface 621, the portion 621a' couple to the first side surface 623. The gap G is formed between the first portion 741 and the portion 621a'. However, the first portion 741 overlaps the portion 621a" coupled to the second side surface 625. Similarly, the second portion 742 of the second pad electrode 74 is separated from, in the outer edge 622a of the upper surface 622, the portion 622a' coupled to the first side surface 624. The gap G is formed between the second portion 742 and the portion 622a'. However, the second portion 742 overlaps the portion 622a" coupled to the second side surface 625.

With such a configuration as well, portions close to the resonating section 61 in the outer edges 731a and 741a of the first portions 731 and 741 are separated from the outer edge 621a of the lower surface 621. Portions close to the resonating section 61 in the outer edges 732a and 742a of the second portions 732 and 742 are separated from the outer edge 622a of the upper surface 622. Therefore, the portions of the first portions 731 and 741 and the second portions 732 and 742 on sides close to the resonating section 61 less easily peel. It is possible to effectively suppress deterioration in the resonating characteristic, in particular, the DLD characteristic of the resonator element 5.

Third Embodiment

Figure 10:
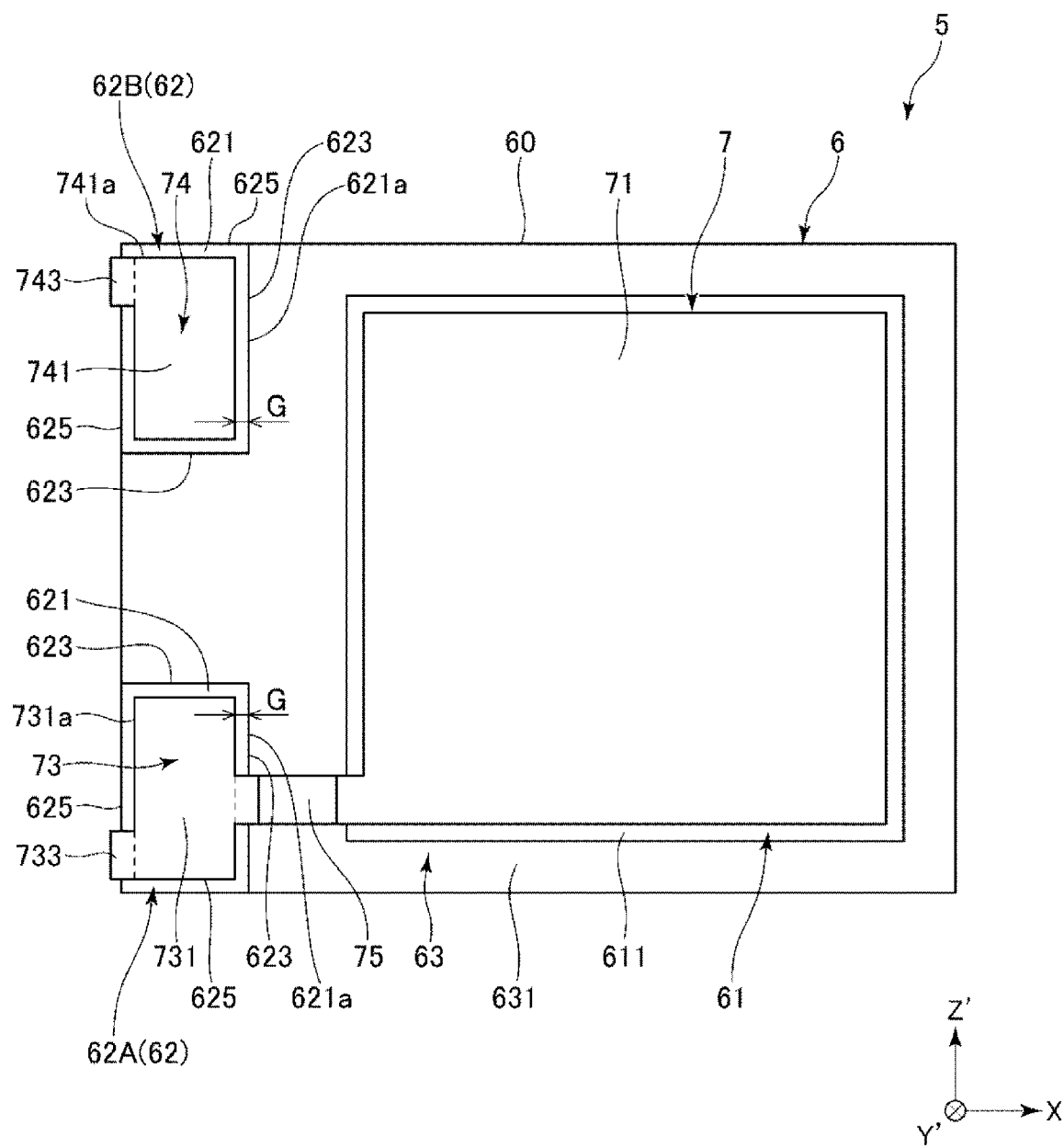
FIG. 10 is a plan view of a resonator element according to a third embodiment viewed from the Y'-axis direction minus side.
Figure 11:
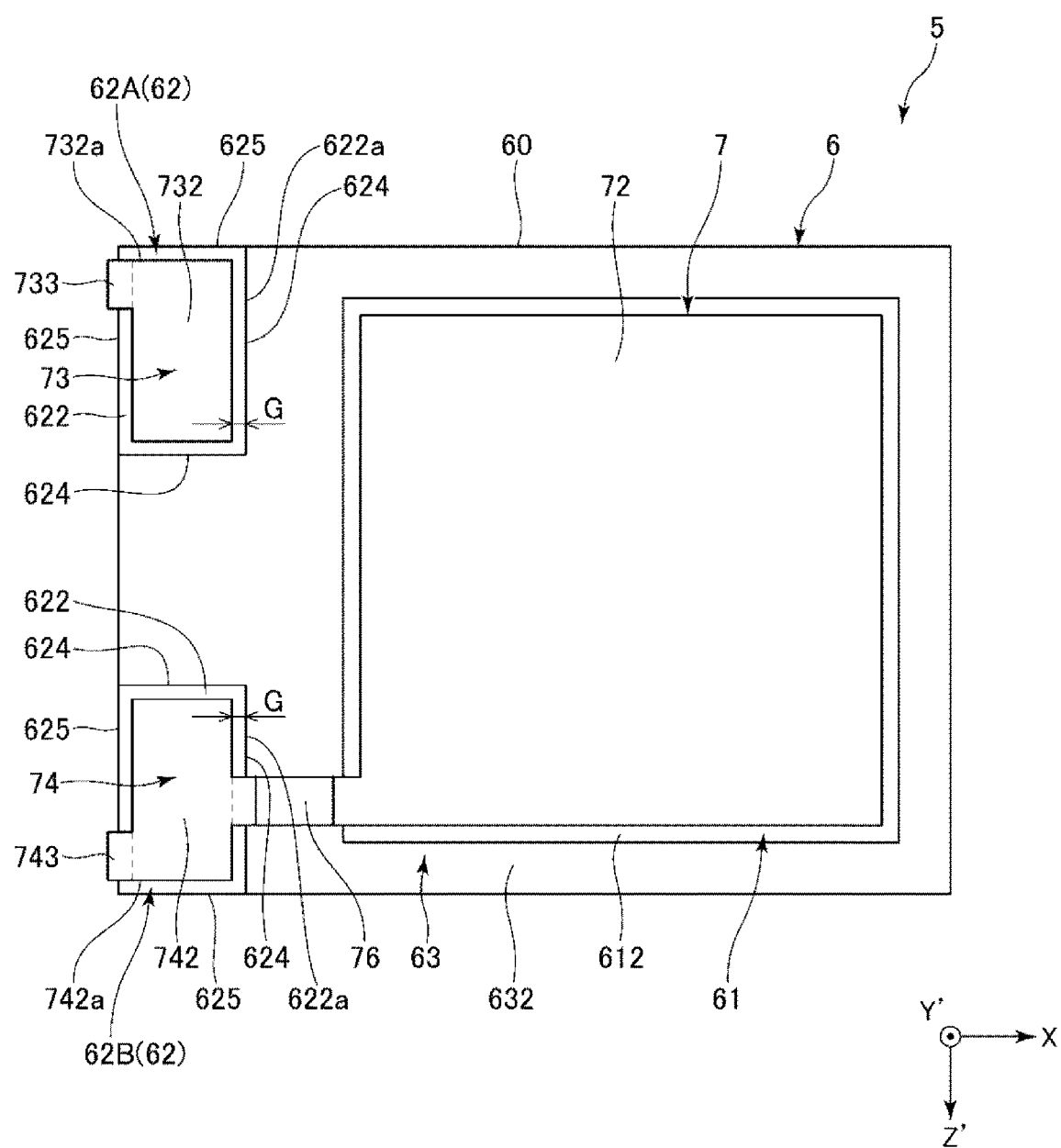
FIG. 11 is a plan view of the resonator element according to the third embodiment viewed from the Y'-axis direction plus side.
Figure 12:
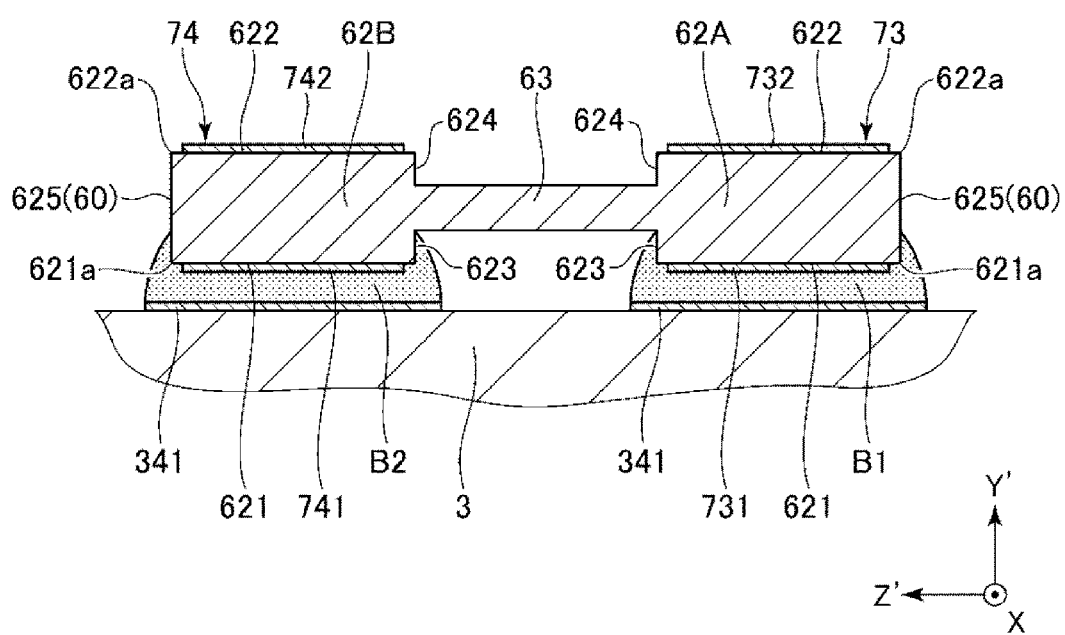
FIG. 12 is a sectional view showing a bonded state of the resonator element according to the third embodiment and a base.

FIG. 10 is a plan view of a resonator element according to a third embodiment viewed from the Y'-axis direction minus side. FIG. 11 is a plan view of the resonator element according to the third embodiment viewed from the Y'-axis direction plus side. FIG. 12 is a sectional view showing a bonded state of the resonator element and a base.

The oscillator 1 according to this embodiment is the same as the oscillator 1 according to the first embodiment except that the configuration of the resonator element 5 is different. In the following explanation, concerning the oscillator 1 according to the third embodiment, differences from the first embodiment are mainly explained. Explanation concerning similarities is omitted. In FIGS. 10 to 12, the same components as the components in the embodiments explained above are denoted by the same reference numerals and signs.

As shown in FIGS. 10 and 11, in the resonator element 5 according to this embodiment, the supporting section 62 includes a first supporting section 62A in which the first pad electrode 73 is disposed and a second supporting section 62B separated from the first supporting section 62A, the second pad electrode 74 being disposed in the second supporting section 62B. The first supporting section 62A and the second supporting section 62B are arranged side by side in the Z'-axis direction. The coupling section 63 is located between the first supporting section 62A and the second supporting section 62B. The first supporting section 62A and the second supporting section 62B are coupled via the coupling section 63.

In such a resonator element 5, as shown in FIG. 12, the first supporting section 62A is bonded to the base 3 via the bonding member B1 and the second supporting section 62B is bonded to the base 3 via the bonding member B2. The supporting section 62 is divided into the first supporting section 62A and the second supporting section 62B. The coupling section 63 thinner than the supporting section 62 is located between the first supporting section 62A and the second supporting section 62B. Consequently, it is possible to suppress spread of the bonding member B1 to the second supporting section 62B side and suppress spread of the bonding member B2 to the first supporting section 62A side. Therefore, it is possible to effectively suppress contact of the bonding members B1 and B2.

As explained above, in the resonator element 5 according to this embodiment, the supporting section 62 includes the first supporting section 62A in which the first pad electrode 73 is disposed and the second supporting section 62B separated from the first supporting section 62A, the second pad electrode 74 being disposed in the second supporting section 62B. The coupling section 63 includes a portion located between the first supporting section 62A and the second supporting section 62B and couples the first supporting section 62A and the second supporting section 62B. With such a configuration, it is possible to effectively suppress contact of the bonding members B1 and B2.

Fourth Embodiment

Figure 13:
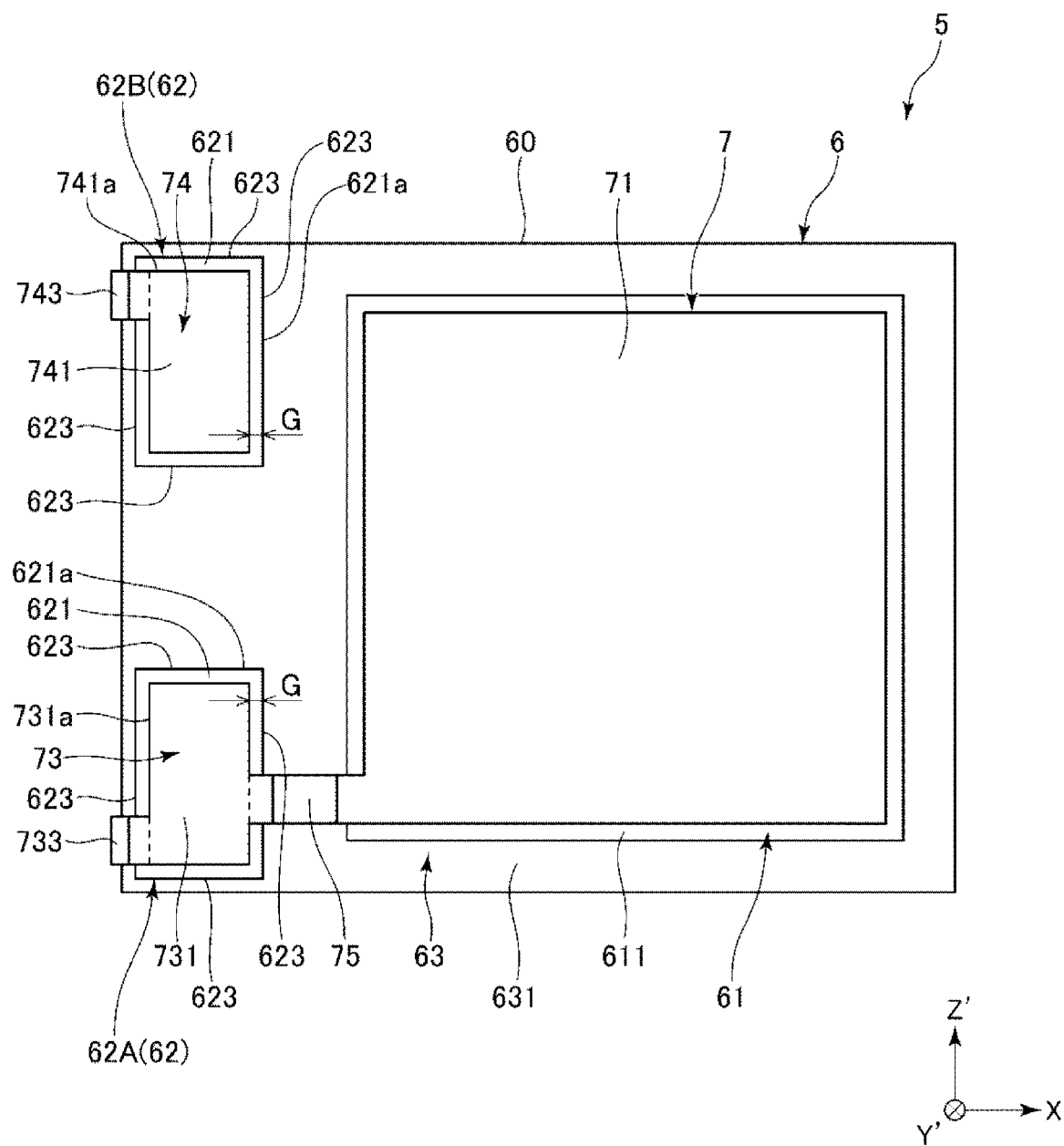
FIG. 13 is a plan view of a resonator element according to a fourth embodiment viewed from the Y'-axis direction minus side.
Figure 14:
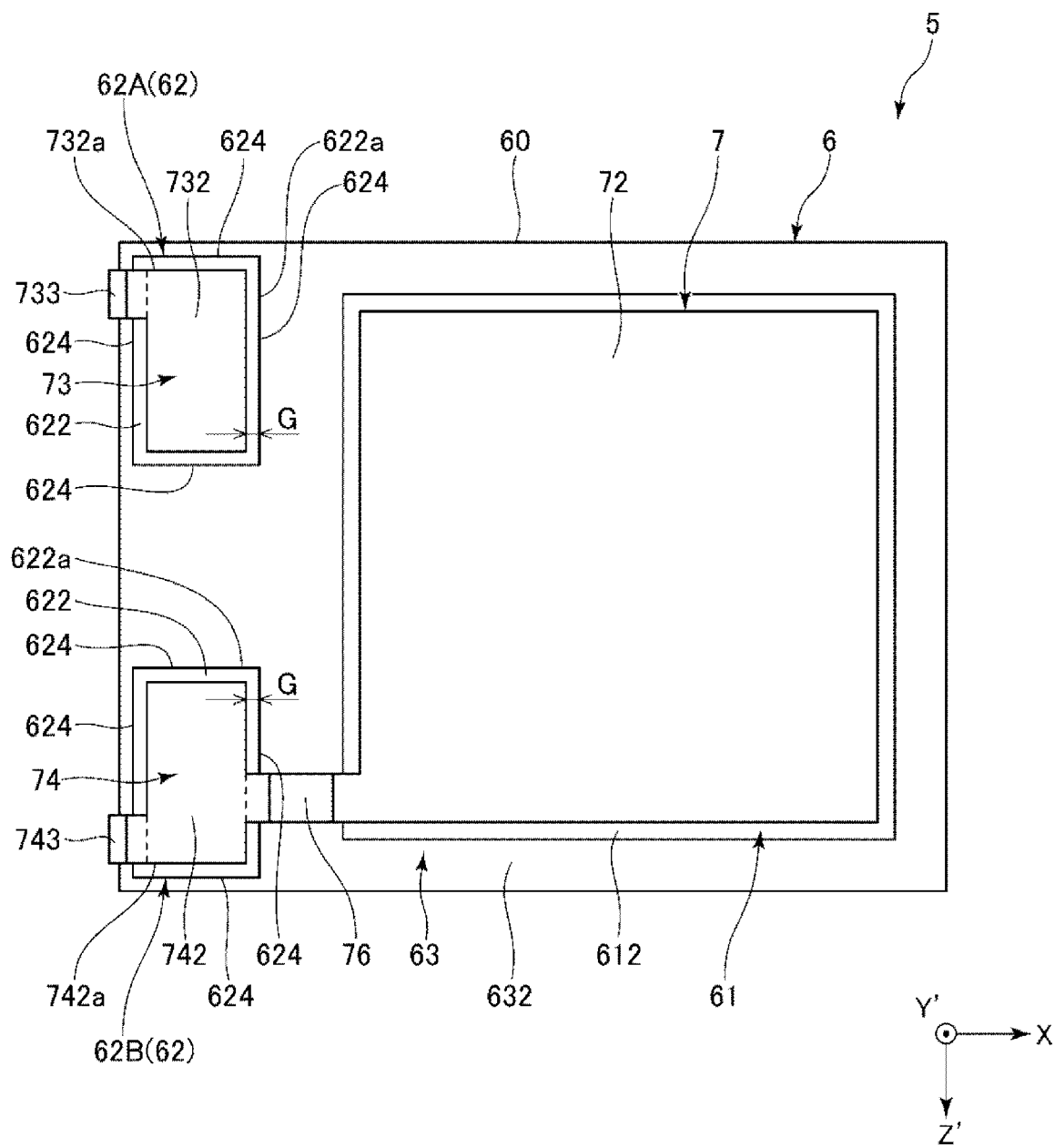
FIG. 14 is a plan view of the resonator element according to the fourth embodiment viewed from the Y'-axis direction plus side.

FIG. 13 is a plan view of a resonator element according to a fourth embodiment viewed from the Y'-axis direction minus side. FIG. 14 is a plan view of the resonator element according to the fourth embodiment viewed from the Y'-axis direction plus side.

The oscillator 1 according to this embodiment is the same as the oscillator 1 according to the third embodiment except that the configuration of the resonator element 5 is different. In the following explanation, concerning the oscillator 1 according to the fourth embodiment, differences from the third embodiment are mainly explained. Explanation concerning similarities is omitted. In FIGS. 13 and 14, the same components as the components in the embodiments explained above are denoted by the same reference numerals and signs.

As shown in FIGS. 13 and 14, in the resonator element 5 according to this embodiment, the coupling section 63 is disposed to surround the entire periphery of the first supporting section 62A and the coupling section 63 is disposed to surround the entire periphery of the second supporting section 62B. That is, the second side surface 625 configuring the outer side surface 60 of the quartz crystal substrate 6 is not included in the side surfaces of the supporting section 62. The entire periphery of the side surfaces is configured by the first side surfaces 623 and 624. With such a configuration as well, it is possible to exert the same effects as the effects in the first embodiment.

Fifth Embodiment

Figure 15:
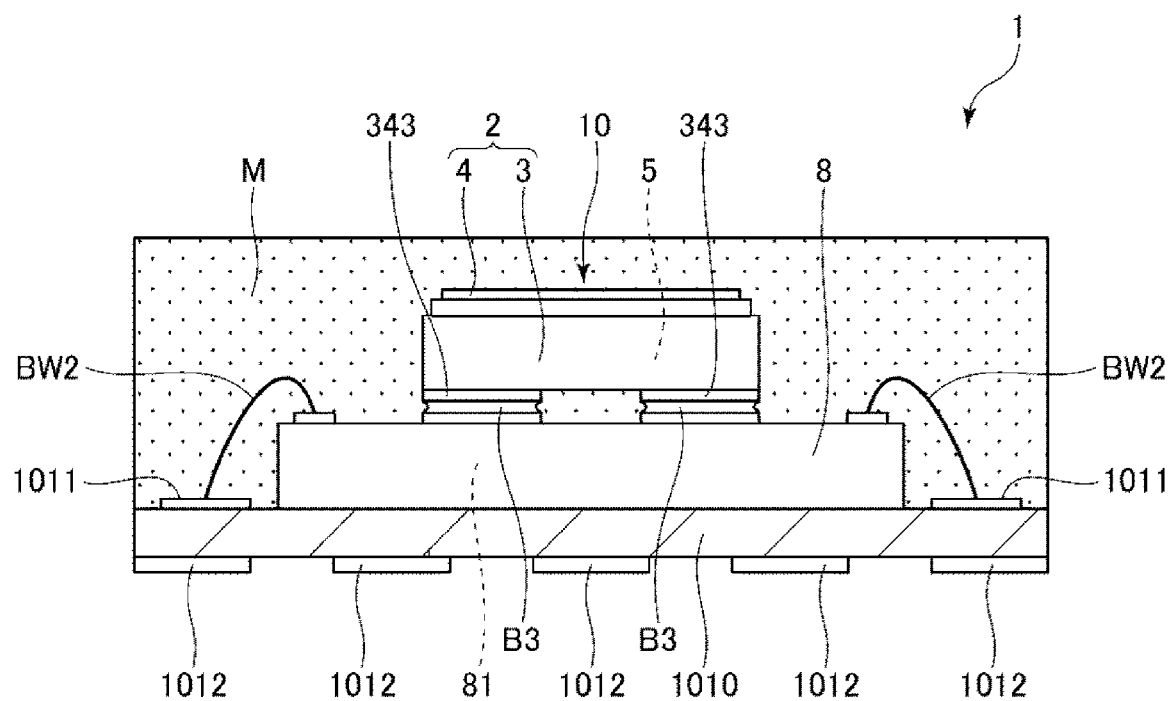
FIG. 15 is a sectional view of an oscillator according to a fifth embodiment.

FIG. 15 is a sectional view showing an oscillator according to a fifth embodiment.

The oscillator 1 shown in FIG. 15 includes a supporting substrate 1010, the circuit element 8 mounted on the supporting substrate 1010, the resonator device 10 mounted on the circuit element 8, and a mold material M that molds the circuit element 8 and the resonator device 10. That is, in the oscillator 1 according to this embodiment, the circuit element 8 is disposed on the outer side of the package 2.

The supporting substrate 1010 is, for example, an interposer substrate. A plurality of coupling terminals 1011 are disposed on the upper surface of the supporting substrate 1010. A plurality of mounting terminals 1012 are disposed on the lower surface of the supporting substrate 1010. A not-shown internal wire is disposed in the supporting substrate 1010. The coupling terminals 1011 are electrically coupled to the mounting terminals 1012 corresponding thereto via the internal wire. Such a supporting substrate 1010 is not particularly limited. For example, a silico substrate, a ceramic substrate, a resin substrate, a glass substrate, or a glass epoxy substrate can be used.

The circuit element 8 is bonded to the upper surface of the supporting substrate 1010 via a die attach material. The circuit element 8 is electrically coupled to the coupling terminals 1011 via bonding wires BW2 and is electrically coupled to the resonator device 10 via conductive bonding members B3 such as solder.

The mold material M molds the circuit element 8 and the resonator device 10 and protects the circuit element 8 and the resonator device 10 from moisture, dust, shock, and the like. The mold material M is not particularly limited. For example, thermosetting epoxy resin can be used. The mold material M can be molded by a transfer mold method.

Sixth Embodiment

Figure 16:
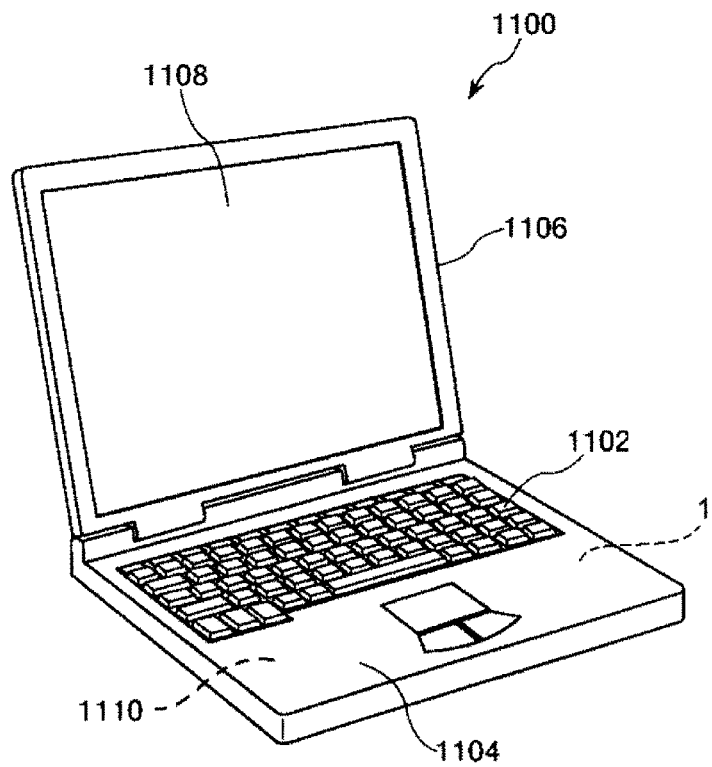
FIG. 16 is a perspective view showing a personal computer functioning as an electronic device according to a sixth embodiment.

FIG. 16 is a perspective view showing a personal computer functioning as an electronic device according to a sixth embodiment.

A personal computer 1100 functioning as an electronic device shown in FIG. 16 is configured by a main body section 1104 including a keyboard 1102 and a display unit 1106 including a display section 1108. The display unit 1106 is turnably supported with respect to the main body section 1104 via a hinge structure section. The oscillator 1 is incorporated in such a personal computer 1100. The personal computer 1100 includes an arithmetic processing circuit 1110 that performs arithmetic processing concerning control of the keyboard 1102, the display section 1108, and the like. The arithmetic processing circuit 1110 operates based on an oscillation signal output from the oscillator 1.

In this way, the personal computer 1100 functioning as the electronic device includes the oscillator 1 and the arithmetic processing circuit 1110 that operates based on the oscillation signal output from the oscillator 1. Therefore, the personal computer 1100 can enjoy the effects of the oscillator 1 explained above and exert excellent reliability.

Seventh Embodiment

Figure 17:
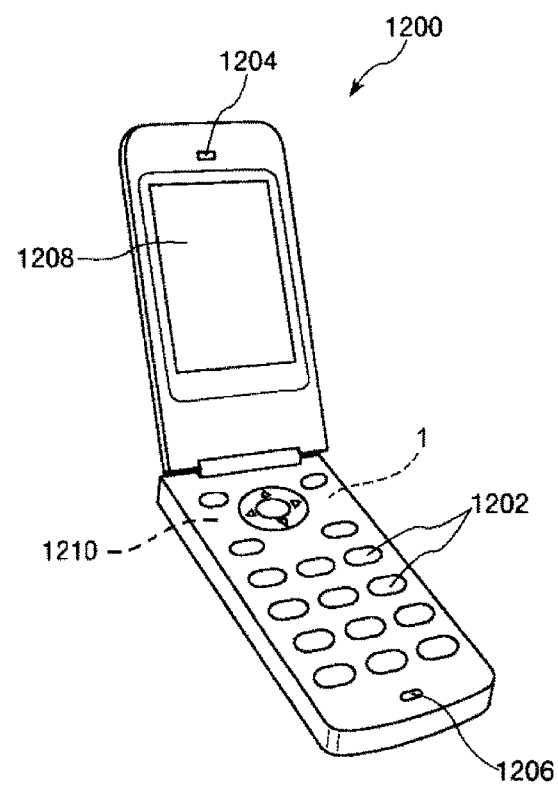
FIG. 17 is a perspective view showing a cellular phone functioning as an electronic device according to a seventh embodiment.

FIG. 17 is a perspective view showing a cellular phone functioning as an electronic device according to a seventh embodiment.

A cellular phone 1200 functioning as an electronic device shown in FIG. 17 includes a not-shown antenna, a plurality of operation buttons 1202, an ear piece 1204, and a mouth piece 1206. A display section 1208 is disposed between the operation buttons 1202 and the ear piece 1204. The oscillator 1 is incorporated in such a cellular phone 1200. The cellular phone 1200 includes an arithmetic processing circuit 1210 that performs arithmetic processing concerning control of the operation buttons 1202 and the like. The arithmetic processing circuit 1210 operates based on an oscillation signal output from the oscillator 1.

In this way, the cellular phone 1200 functioning as the electronic device includes the oscillator 1 and the arithmetic processing circuit 1210 that operates based on the oscillation signal output from the oscillator 1. Therefore, the cellular phone 1200 can enjoy the effects of the oscillator 1 explained above and exert high reliability.

Eighth Embodiment

Figure 18:
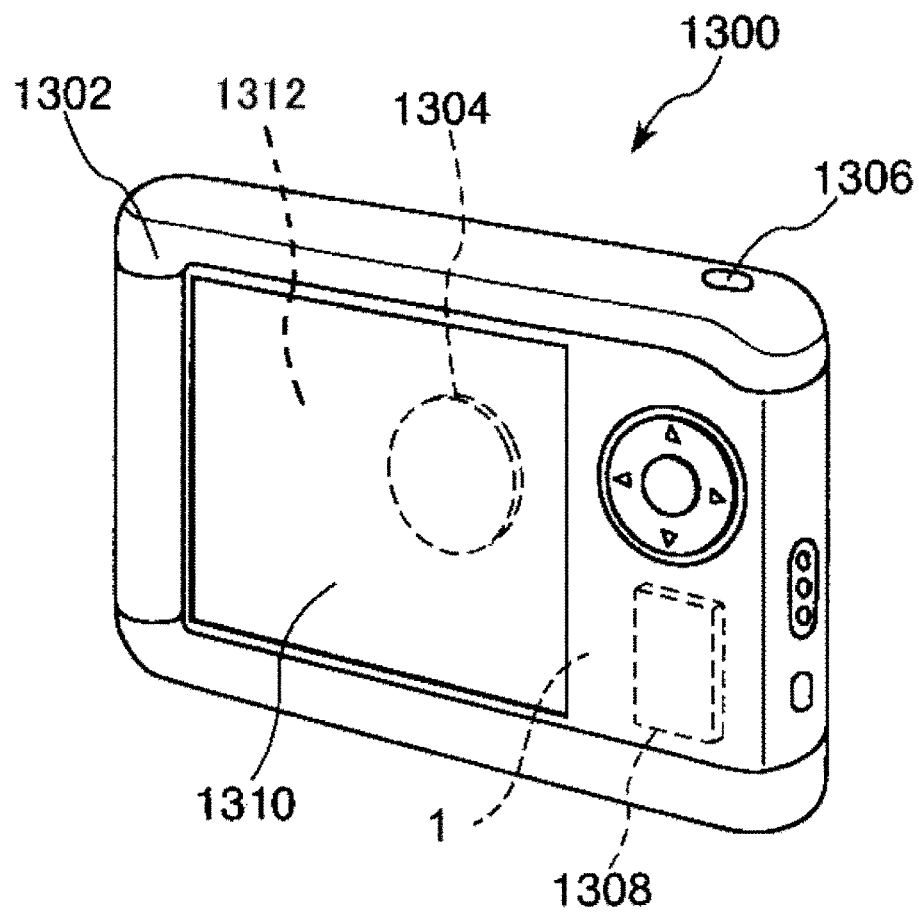
FIG. 18 is a perspective view showing a digital still camera functioning as an electronic device according to an eighth embodiment.

FIG. 18 is a perspective view showing a digital still camera functioning as an electronic device according to an eighth embodiment.

A digital still camera 1300 shown in FIG. 18 includes a body 1302. A display section 1310 that performs display based on an imaging signal by a CCD is provided on the back of the body 1302. The display section 1310 functions as a finder that displays an object as an electronic image. A light receiving unit 1304 including an optical lens and a CCD is provided on the front side (the rear side in FIG. 18) of the body 1302. When a photographer confirms the object image displayed on the display section 1310 and presses a shutter button 1306, an imaging signal of the CCD at that point in time is transferred to and stored in a memory 1308. For example, the oscillator 1 is incorporated in such a digital still camera 1300. The digital still camera 1300 includes an arithmetic processing circuit 1312 that performs arithmetic processing concerning control of the display section 1310, the light receiving unit 1304, and the like. The arithmetic processing circuit 1312 operates based on an oscillation signal output from the oscillator 1.

In this way, the digital still camera 1300 functioning as the electronic device includes the oscillator 1 and the arithmetic processing circuit 1312 that operates based on an oscillation signal output from the oscillator 1. Therefore, the digital still camera 1300 can enjoy the effects of the oscillator 1 explained above and exert high reliability.

The electronic device according to the present disclosure can be applied to, besides the personal computer, the cellular phone, the digital still camera, and the like explained above, for example, a smartphone, a tablet terminal, a watch (including a smartwatch), an inkjet-type ejecting apparatus (e.g., an inkjet printer), a laptop personal computer, a television, a wearable terminal such as a HMD (head mounted display), a video camera, a video tape recorder, a car navigation device, a pager, an electronic notebook (including an electronic notebook with a communication function), an electronic dictionary, an electronic calculator, an electronic game machine, a word processor, a work station, a video phone, a television monitor for crime prevention, an electronic binocular, a POS terminal, medical devices (e.g., an electronic thermometer, a manometer, a blood sugar meter, an electrocardiographic device, an ultrasonic diagnosis device, and an electronic endoscope), a fish finder, various measuring devices, a device for a mobile terminal base station, meters (e.g., meters for a vehicle, an airplane, and a ship), a flight simulator, and a network server.

Ninth Embodiment

Figure 19:
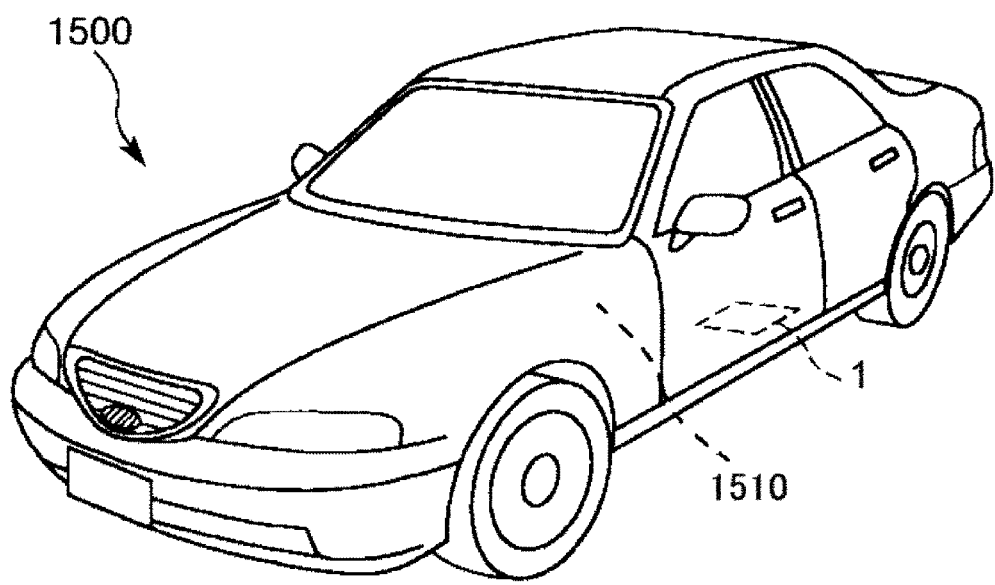
FIG. 19 is a perspective view showing an automobile functioning as a vehicle according to a ninth embodiment.

FIG. 19 is a perspective view showing an automobile functioning as a vehicle according to a ninth embodiment.

The oscillator 1 and an arithmetic processing circuit 1510 that operates based on an oscillation signal output from the oscillator 1 are incorporated in an automobile 1500 shown in FIG. 19. The oscillator 1 and the arithmetic processing circuit 1510 can be widely applied to, for example, a keyless entry system, an immobilizer, a car navigation system, a car air conditioner, an antilock brake system (ABS), an airbag, a tire pressure monitoring system (TPMS), an engine control system, a battery monitor of a hybrid automobile and an electric automobile, and an electronic control unit (ECU) such as a vehicle body posture control system.

In this way, the automobile 1500 functioning as the vehicle includes the oscillator 1 and the arithmetic processing circuit 1510 that operates based on an oscillation signal output from the oscillator 1. Therefore, the automobile 1500 can enjoy the effects of the oscillator 1 explained above and exert high reliability.

The vehicle is not limited to the automobile 1500 and can also be applied to, for example, an airplane, a ship, an AGV (unmanned guided vehicle), a bipedal walking robot, an unmanned aircraft such as a drone.

The resonator element, the resonator device, the oscillator, the electronic device, and the vehicle according to the present disclosure are explained above based on the embodiments shown in the figures. However, the present disclosure is not limited to this. The components of the sections can be replaced with any components having the same functions. Any other components may be added to the present disclosure. The present disclosure may be a combination of any two or more configurations among the embodiments.

What is claimed is:

1. A resonator element comprising:
   a quartz crystal substrate including a supporting section, a resonating section, and a coupling section coupling the supporting section and the resonating section and having thickness smaller than thickness of the supporting section, the supporting section including a first principal plane orthogonal to a first direction of the thickness and a first side surface coupling the first principal plane and the coupling section, the coupling section surrounding the resonating section in a plan view extending from the supporting section in a second direction orthogonal to the first direction;
   a first excitation electrode disposed in the resonating section;
   a second excitation electrode disposed in the resonating section and overlapping the first excitation electrode via the resonating section in the plan view;
   a first pad electrode including a first portion disposed on the first principal plane, the first pad electrode being electrically coupled to the first excitation electrode; and
   a second pad electrode including a first portion disposed on the first principal plane, the second pad electrode being electrically coupled to the second excitation electrode,
   wherein at least one of the first portions of the first pad electrode and the second pad electrode is disposed so as to have a gap with a part of an outer edge of the first principal plane in the plan view, and the part of the outer edge is a coupling portion of the first principal plane and the first side surface, and
   wherein the first and second pad electrodes are arranged along a same axis of the supporting section, and
   wherein a portion of the supporting, section toward the outer edge in a third direction orthogonal to the second direction, and uncovered by the first pad electrode or the second pad electrode, overlaps a portion of the coupling section uncovered by the first excitation electrode when viewed in the second direction, the gap being disposed at the portion of the supporting section.

2. The resonator element according to claim 1, wherein at least one of the first portions of the first pad electrode and the second pad electrode are disposed so as to have a gap with the outer edge of the first principal plane in the plan view.

3. The resonator element according to claim 1, wherein
   the supporting section includes a first supporting section in which the first pad electrode is disposed and a second supporting section separated from the first supporting section, the second pad electrode being disposed in the second supporting section, and
   the coupling section includes a portion located between the first supporting section and the second supporting section and couples the first supporting section and the second supporting section.

4. The resonator element according to claim 1, wherein
   the supporting section further includes a second principal plane that is in a front-rear relation with the first principal plane and a second side surface coupling the first principal plane and the second principal plane and configuring an outer side surface of the quartz crystal substrate, and
   the first pad electrode and the second pad electrode respectively include a second portion disposed on the second principal plane, and a third portion disposed on the second side surface and coupling the first portion and the second portion.

5. A resonator device comprising:
   the resonator element according to claim 1; and
   a package configured to house the resonator element.

6. An oscillator comprising:
   the resonator element according to claim 1; and
   an oscillation circuit configured to cause the resonator element to oscillate.

7. An electronic device comprising:
   the oscillator according to claim 6; and
   an arithmetic processing circuit configured to operate based on an oscillation signal output from the oscillator.

8. A vehicle comprising:
   the oscillator according to claim 6; and
   an arithmetic processing circuit configured to operate based on an oscillation signal output from the oscillator.

* * * * *